March 6, 1956 R. B. TROUSDALE 2,737,587

TRANSISTOR MULTIVIBRATOR

Filed March 7, 1955

INVENTOR.
ROBERT B. TROUSDALE
BY F. H. Henson
AGENT

United States Patent Office 2,737,587

Patented Mar. 6, 1956

2,737,587

TRANSISTOR MULTIVIBRATOR

Robert B. Trousdale, Webster, N. Y., assignor, by mesne assignments, to General Dynamics Corporation, a corporation of Delaware Application March 7, 1955, Serial No. 492,597

9 Claims. (Cl. 250—36)

This invention relates in general to multivibrator circuits, and more particularly to transistor multivibrator circuits. A transistor multivibrator has many applications. For example, the transistor multivibrator herein disclosed is also shown and described in conjunction with an electronic telephone system which forms the subject matter of my co-pending application, Serial No. 492,064, filed March 4, 1955, and assigned to the same assignee as the present invention.

As is well known in the transistor art, a transistor has substantial base current flow even when biased for non-conduction. The amount of base current flow depends, of course, upon base circuit impedance which varies considerably from transistor to transistor. Also the base circuit impedance of any particular transistor varies greatly with operating temperature. In free-running multivibrators from which a particular output frequency is desired, it has been necessary, prior to this invention, to provide variable resistors or capacitors in each multivibrator circuit to compensate for the variance in base circuit impedance between transistors and to compensate for differences in operating temperature.

Accordingly, it is the general object of this invention to provide a new and improved transistor multivibrator circuit.

It is a more particular object of this invention to provide a new and improved transistor multivibrator circuit in which the frequency of operation is essentially independent of the base circuit impedance of the transistors used in the multivibrator circuit and is also essentially independent of fluctuations in the voltage applied to the circuit.

Briefly, the invention accomplishes the above cited objects by providing a unidirectional conducting device in series with the capacitor which couples the collector circuit of one transistor to the base circuit of the other transistor. The charging circuit for the capacitor is isolated from the base circuit of the transistor by the unidirectional conducting device.

For a better understanding of the invention, reference may be made to the drawing in which.

Figure 1:
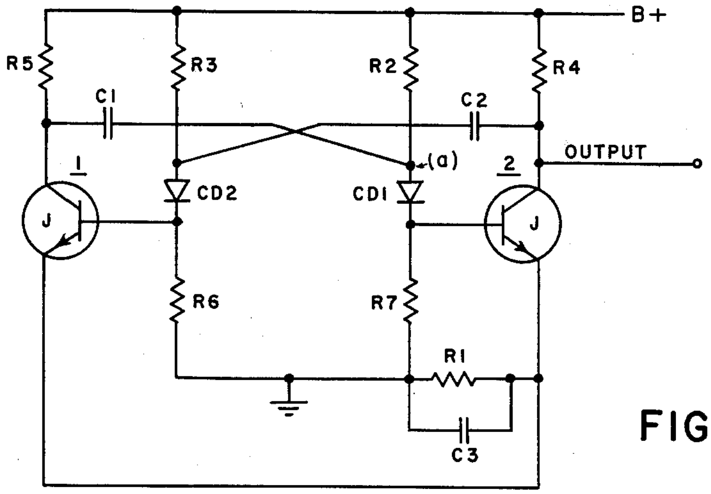
Fig. 1 shows a multivibrator circuit.

The multivibrator circuit has been shown as comprising NPN junction transistors 1 and 2, which may be type TI–201. If it be assumed that transistor 2 is conducting and that transistor 1 has just started to conduct, the potential at the collector terminal of transistor 1 begins to drop from the voltage value of a suitable source of positive potential, identified as B+, to a potential slightly above ground as determined by the voltage drop across emitter bias resistor R1 due to current flow from ground through resistor R1, transistor 1, and resistor R5 to B+. Point (*a*) at crystal diode CD1 had been standing at a potential slightly above ground because of the conduction of transistor 2. The voltage swing at the collector of transistor 1 is coupled through capacitor C1 to point (*a*)

and thus drives this point to a negative potential. Crystal diode CD1 is now biased in the reverse direction so that practically no current flows therethrough. The potential on the base of transistor 2 drops to approximately ground potential when diode CD1 is cut off, and thus transistor 2 is rendered non-conductive.

Capacitor C1 now charges through resistor R2 toward the supply voltage B+. It can be seen that crystal diode CD1 serves to isolate the charging circuit for capacitor C1 from the base circuit of transistor 2. By cutting off the base circuit during the charge time of the capacitor, the frequency of operation of the circuit is made independent of the base circuit impedance.

Resistor R7 serves to maintain the base terminal of transistor 2 at ground potential when cut off from capacitor C1 by diode CD1. The base of transistor 2 is thus negative with respect to its emitter and the transistor is cut off. In response to the cessation of collector current flow in transistor 2, the voltage at the collector terminal of transistor 2 rises from a potential slightly above ground toward the potential of B+. This voltage change is coupled through capacitor C2 and diode CD2 to the base of transistor 1 to assist in the buildup of conduction therein.

When capacitor C1 becomes charged sufficiently to bias crystal diode CD1 in the conducting direction, the capacitor continues to charge toward a voltage value determined by the voltage division across resistors R2 and R7. Before the charge on capacitor C1 reaches this point, however, the base terminal of transistor 2 is made slightly positive with respect to its emitter potential. Transistor 2 thus begins to conduct and its collector potential swings from B+ toward the emitter bias potential. This swing is reflected through capacitor C2 and serves to bias crystal diode CD2 in the non-conducting direction. Transistor 1 is, of course, rendered non-conductive from ground potential through resistor R6 when its base circuit is cut off from capacitor C2 by diode CD2. The resulting rise of potential at the collector of transistor 1 in response to the cessation of collector current flow is reflected through capacitor C1 to the base terminal of transistor 2 to assist in its buildup. Capacitor C2 then charges through resistor R3 until it is charged sufficiently to bias diode CD2 in the conducting direction and then continues to charge through resistors R3 and R6 until transistor 1 is rendered conductive.

The two transistors are alternately operated at a frequency determined by the impedance of capacitor C1 in conjunction with resistor R2 and capacitor C2 in conjunction with resistor R3. As previously mentioned, resistor R1 is utilized to provide emitter bias for both transistors. The current through this resistor is substantially constant. By-pass capacitor C3 serves to maintain the emitter bias potential during the transfer of operation from one transistor to the other.

As shown, the output signal is taken from across resistor R4 in the collector circuit of transistor 2. The output signal is, of course, a squarewave which swings between +B volts and a voltage equal to approximately the emitter bias potential.

Figure 2:
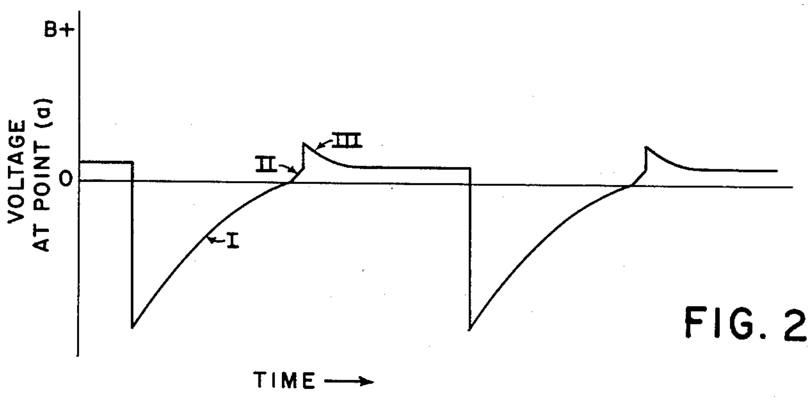
Fig. 2 shows the voltage-time relationship at a particular point in a multivibrator circuit.

Figure 2 is a graphic illustration of the voltage appearing at point (*a*) of Fig. 1 during the cycle of operation. As previously described, when transistor 1 begins to conduct, the voltage at point (*a*) drops to a negative value and then capacitor C1 charges exponentially toward B+ (region I of the curve). When the potential rises to ground potential, diode CD1 becomes conductive and capacitor C1 continues to charge toward the voltage division across resistors R2 and R7 (region II of the curve). However, when the potential at point (*a*) rises slightly above ground so that the base of transistor 2 is positive with respect to its emitter, transistor 2 begins to conduct.

When transistor 1 is cut off, the rise of potential is coupled to point (*a*) through capacitor C1. Capacitor C1 then discharges through conducting transistor 2 (region III of the curve) and point (*a*) remains at approximately the emitter bias potential until transistor 1 is again rendered conductive.

An output frequency of 1 cycle per second is obtained from the multivibrator circuit when the following values of circuit components are used:

| | | |
|---|---|---|
| R1 | ohms | 1,000 |
| R2 | do | 220,000 |
| R3 | do | 220,000 |
| R4 | do | 20,000 |
| R5 | do | 20,000 |
| R6 | do | 100,000 |
| R7 | do | 100,000 |
| C1 | microfarads | 4 |
| C2 | do | 4 |

The exact value of B+ is not important since all voltages, namely, the emitter bias voltage, the voltage swing of the coupling capacitors, and the voltage toward which the coupling capacitors charge, are proportional to B+.

While there has been disclosed what is at present considered to be the preferred embodiment of the invention, other modifications will readily occur to those skilled in the art. It is not, therefore, desired that the invention be limited to the specific arrangement shown and described, and it is intended to cover in the appended claims all such modifications as fall within the true spirit and scope of the invention.

What is claimed is:

1. A multivibrator circuit comprising first and second transistors, each of said transistors having collector and base electrodes, first reactive means and first unidirectional conducting means connected in series between the collector electrode of said first transistor and the base electrode of said second transistor, second reactive means and second unidirectional conducting means connected in series between the collector electrode of said second transistor and the base electrode of said first transistor, a charging circuit for each of said reactive means, each of said unidirectional conducting means being poled so as to isolate the charging circuit for its associated reactive means from its associated base electrode during the charge time of said reactive means.

2. The multivibrator circuit of claim 1 in which said first and second means comprise capacitors.

3. The multivibrator circuit of claim 2 in which said first and second unidirectional conducting means comprise crystal diodes.

4. A multivibrator circuit comprising first and second transistors, each of said transistors having collector, emitter, and base electrodes, a collector impedance element connected between each collector electrode and a first source of potential, a common emitter impedance element connected between said emitter electrodes in multiple and a second source of potential, a base impedance element connected between each base electrode and said second source of potential, first reactive means and first unidirectional conducting means connected in series between the collector electrode of said first transistor and the base electrode of said second transistor, second reactive means and second unidirectional conducting means connected in series between the collector electrode of said second transistor and the base electrode of said first transistor, a charging circuit for each of said reactive means, each of said unidirectional conducting means being poled so as to isolate the charging circuit for its associated reactive means from its associated base electrode during the charge time of said reactive means.

5. The multivibrator circuit of claim 4 in which said first and second reactive means comprise capacitors.

6. The multivibrator circuit of claim 5 in which said first and second unidirectional conducting means comprise crystal diodes.

7. A multivibrator circuit comprising first and second transistors, each of said transistors having collector, emitter, and base electrodes, a collector impedance element connected between each collector electrode and a first source of potential, a common emitter impedance element connected between said emitter electrodes in multiple and a second source of potential, a base impedance element connected between each base electrode and said second source of potential, first reactive means and first unidirectional conducting means connected in series between the collector electrode of said first transistor and the base electrode of said second transistor, second reactive means and second unidirectional conducting means connected in series between the collector electrode of said second transistor and the base electrode of said first transistor, a charging circuit for each of said reactive means, each of said charging circuits comprising an impedance element connected between said first source of potential and the connecting point between its associated series connected reactive means and unidirectional conducting means, each of said unidirectional conducting means being poled so as to isolate the charging circuit for its associated reactive means from its associated base electrode during the charge time of said reactive means.

8. The multivibrator circuit of claim 7 in which said first and second reactive means comprise capacitors.

9. The multivibrator of claim 8 in which said first and second unidirectional conducting means comprise crystal diodes.

No references cited.